United States Patent
Sekiya et al.

(10) Patent No.: US 7,601,485 B2
(45) Date of Patent: Oct. 13, 2009

(54) EXPOSURE METHOD

(75) Inventors: Kazuma Sekiya, Tokyo (JP); Takashi Ono, Tokyo (JP); Akihito Kawai, Tokyo (JP)

(73) Assignee: Disco Corporation, Tokyo (JP)

( * ) Notice: Subject to any disclaimer, the term of this patent is extended or adjusted under 35 U.S.C. 154(b) by 610 days.

(21) Appl. No.: 11/360,809

(22) Filed: Feb. 24, 2006

(65) Prior Publication Data

US 2006/0199114 A1    Sep. 7, 2006

(30) Foreign Application Priority Data

Mar. 1, 2005    (JP)    ............... 2005-055787

(51) Int. Cl.
*G03F 7/26*    (2006.01)
*G03F 9/00*    (2006.01)

(52) U.S. Cl. ............... 430/394; 430/311; 430/396

(58) Field of Classification Search ............ 430/311, 430/394, 396
See application file for complete search history.

(56) References Cited

U.S. PATENT DOCUMENTS

| | | | | |
|---|---|---|---|---|
| 6,395,456 | B1 * | 5/2002 | Tamada et al. | 430/312 |
| 2003/0096200 | A1 * | 5/2003 | Liao | 430/394 |
| 2004/0219443 | A1 * | 11/2004 | Spears | 430/30 |

* cited by examiner

*Primary Examiner*—Kathleen Duda
(74) *Attorney, Agent, or Firm*—Smith, Gambrell & Russell, LLP

(57) ABSTRACT

An exposure method for exposing a resist film disposed on one surface of a wafer includes a first exposure step of locating an exposure mask at a first predetermined position with respect to the wafer, and exposing the resist film. The exposure method further includes a second exposure step of displacing the exposure mask relative to the wafer by a predetermined dimension in a predetermined direction to locate the exposure mask at a second predetermined position, and exposing the resist film.

1 Claim, 2 Drawing Sheets

EXPOSURE METHOD

FIELD OF THE INVENTION

This invention relates to an exposure method for exposing a resist film, disposed on one surface of a wafer, through an exposure mask.

DESCRIPTION OF THE PRIOR ART

In the production of a semiconductor chip, for example, a plurality of first cutting streets extending parallel with predetermined spacing, and a plurality of second cutting streets extending parallel with predetermined spacing and perpendicularly to the first cutting streets are arranged on one surface of a semiconductor wafer, and a circuit is formed in each of a plurality of rectangular regions defined by the first cutting streets and the second cutting streets. Then, the wafer is cut along the first cutting streets and the second cutting streets, whereby the plurality of rectangular regions are separated individually to prepare semiconductor chips.

As the manner of cutting the wafer along the first cutting streets and the second cutting streets, proposals have been made in recent times for the manner of disposing a photosensitive resist film on one surface of the wafer, then exposing this resist film through an exposure mask, then developing the resist film to remove its areas corresponding to the first cutting streets and the second cutting streets, and etching the areas of the wafer where the resist film has been removed. These proposals have been put to practical use. If a positive resist film is used as the resist film, its areas corresponding to the first cutting streets and the second cutting streets are exposed, and removed by subsequent development. If a negative resist film is used as the resist film, its areas other than the areas corresponding to the first cutting streets and the second cutting streets are exposed, and the unexposed areas corresponding to the first cutting streets and the second cutting streets are removed by subsequent development.

The exposure of the resist film in the above-described manner of cutting poses the following problems to be solved, particularly if the negative resist film is used: The exposure of the resist film is performed normally in a clean room, but it is extremely difficult, although not impossible, to completely prevent fine dust with a size of the order of several microns from adhering to light transmission regions of the exposure mask (in the case of the above-mentioned semiconductor wafer, the regions corresponding to the rectangular regions where circuits have been formed). If the dust adheres to the light transmission regions of the exposure mask, a fine unexposed area ascribed to the dust is allowed to remain in the region of the resist film to be exposed and, in such an unexposed area, the resist film is removed by subsequent development. As a result, a succeeding etching step arouses a situation where a portion which should not be etched (in the aforementioned semiconductor wafer, the portion in the rectangular region where the circuit has been formed) is also etched.

SUMMARY OF THE INVENTION

A principal object of the present invention is, therefore, to provide a novel and improved exposure method which, even in the event of fine dust adhering to the transmission region of the exposure mask, does not allow an unexposed area to remain in the region of the resist film to be exposed, because of such dust.

According to the present invention, the above principal object is attained by locating an exposure mask at a predetermined position with respect to a wafer, exposing a resist film through the exposure mask, then displacing the exposure mask relative to the wafer by a predetermined dimension in a predetermined direction, and further exposing the resist film through the exposure mask.

That is, according to the present invention, there is provided, as an exposure method for attaining the above principal object, an exposure method for exposing a resist film disposed on one surface of a wafer through an exposure mask, comprising a first exposure step of locating the exposure mask at a first predetermined position with respect to the wafer, and exposing the resist film, and a second exposure step of displacing the exposure mask relative to the wafer by a predetermined dimension in a predetermined direction to locate the exposure mask at a second predetermined position, and exposing the resist film.

Preferably, the predetermined dimension is 10 to 50 μm. The exposure mask preferably has a plurality of first light shielding regions extending parallel with predetermined spacing, a plurality of second light shielding regions extending parallel with predetermined spacing and perpendicularly to the first light shielding regions, and a plurality of rectangular light transmission regions partitioned by the first light shielding regions and the second light shielding regions, and the predetermined direction is preferably the direction of extension of the first light shielding regions. In preferred embodiments, a plurality of first cutting streets extending parallel with predetermined spacing, a plurality of second cutting streets extending parallel with predetermined spacing and perpendicularly to the first cutting streets, and a plurality of rectangular regions partitioned by the first cutting streets and the second cutting streets are defined on the one surface of the wafer; the first light shielding regions, the second light shielding regions, and the light transmission regions of the exposure mask are in correspondence with the first cutting streets, the second cutting streets, and the rectangular regions of the wafer; and the width of the second light shielding region is the width of the second cutting street plus the predetermined dimension.

According to the exposure method of the present invention, even if a fine unexposed area is allowed to remain in the region to be exposed during the first exposure step, because of fine dust adhering to the light transmission region of the exposure mask, such a fine unexposed area is exposed during the second exposure step. Thus, no unexposed area is allowed to remain in the region of the resist film which should be exposed.

DETAILED DESCRIPTION OF THE PREFERRED EMBODIMENTS

The preferred embodiments of the exposure method according to the present invention will now be described in detail with reference to the accompanying drawings.

Figure 1:
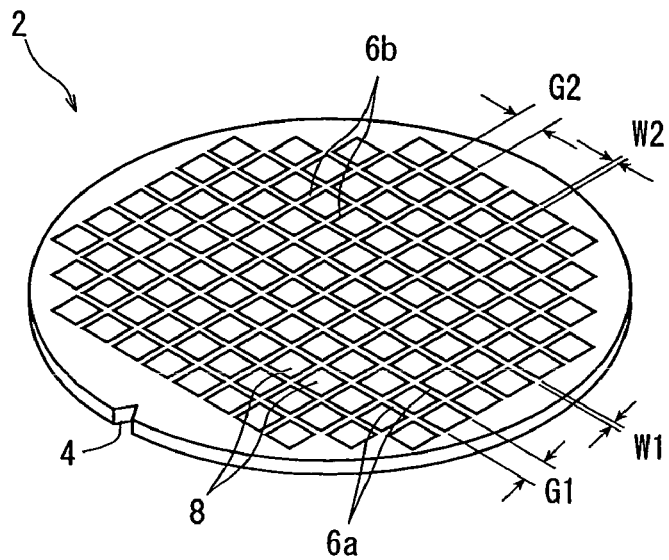
FIG. 1 a perspective view showing a typical example of a wafer to which a preferred embodiment of the exposure method of the present invention is applied.

FIG. 1 shows a typical example of a wafer to which a preferred embodiment of the exposure method of the present invention is applied. A wafer entirely indicated at a numeral 2 is disk-shaped, and has a positioning notch 4 formed in the rim thereof. A plurality of cutting streets arranged in a lattice pattern, namely, a plurality of first cutting streets 6a extending parallel with a predetermined spacing G1, and a plurality of second cutting streets 6b extending parallel with a predetermined spacing G2 and perpendicularly to the first cutting streets 6a, are formed on one surface, i.e., upper surface, of the wafer 2. The first cutting street 6a has a width W1, while the second cutting street 6b has a width W2. The spacing G1 and the spacing G2 may be different from each other, or may be the same as each other. Similarly, the width W1 and the width W2 may be different from each other, or may be the same as each other. The first cutting streets 6a and the second cutting streets 6b define a plurality of rectangular regions 8, and a circuit is formed in each of the rectangular regions 8. A negative resist film 10 (FIGS. 3 and 4) is further disposed on the one surface of the wafer 2. In the illustrated wafer 2, the resist film 10 is disposed on the face where the circuits have been formed, but if desired, the resist film 10 can be disposed on the back of the wafer 2 (in this case, etching to be described later is performed from the back of the wafer 2). The wafer 2 itself is of a form well known to people skilled in the art, so that a description of its details is omitted herein.

Figure 2:
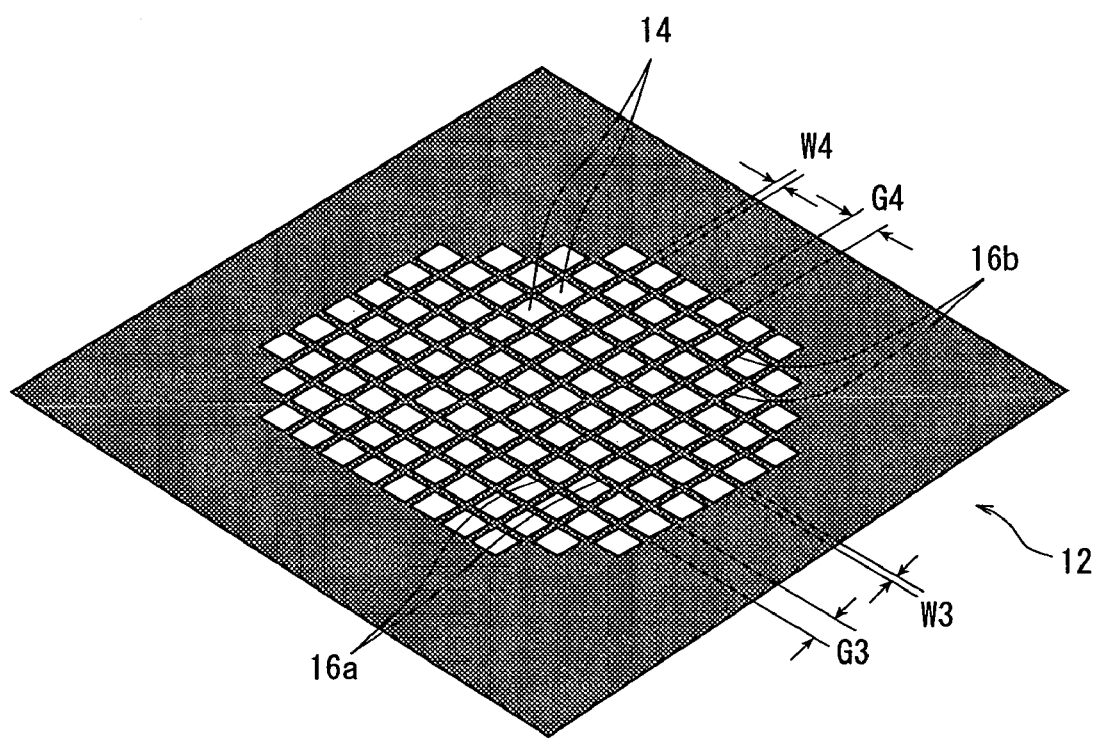
FIG. 2 is a perspective view showing an exposure mask used in the preferred embodiment of the exposure method of the present invention.

FIG. 2 shows an example of an exposure mask used in the preferred embodiment of the exposure method according to the present invention. An exposure mask 2 shown therein is of a generally square shape, and has a plurality of light transmission regions 14 in a central portion thereof, and its portions other than the light transmission regions 14 are light shielding regions. Such an exposure mask 12 may be a reticle mask formed of a glass substrate coated with a chromium plating, and the light transmission regions 14 may, for example, be transparent, while the light shielding regions may, for example, be of a black color (in FIG. 2, the light shielding regions are marked with many spots, instead of being filled in with black, for convenience in showing leader lines for numerals). The plurality of light transmission regions 14 are brought into correspondence with the plurality of rectangular regions 8 in the wafer 2. In further detail, the plurality of light transmission regions 14 are defined by a plurality of first light shielding regions 16a and a plurality of second light shielding regions 16b corresponding, respectively, to the plurality of first cutting streets 6a and the plurality of second cutting streets 6b in the wafer 2. A spacing G3 between the first light shielding regions 16a, and the width W3 of the first light shielding region 16a are set to be substantially the same as the spacing G1 between the first cutting streets 6a, and the W1 of the first cutting street 6a. On the other hand, as clearly understood by reference to FIGS. 3 and 4, a spacing G4 between the second light shielding regions 16b is set to be smaller by a predetermined dimension X than the spacing G2 between the second cutting streets 6b, namely, G4=G2−X. The width W4 of the second light shielding region 16b is set to be larger by the predetermined dimension X than the W2 of the second cutting street 6b, namely, W4=W2+X.

In the exposure method of the present invention, it is important to perform a first exposure step of locating the exposure mask 12 at a first predetermined position with respect to the wafer 2, and exposing the resist film 10, and perform a second exposure step of displacing the exposure mask 12 relative to the wafer 2 by the predetermined dimension in a predetermined direction to locate the exposure mask 12 at a second predetermined position, and exposing the resist film 10.

Figure 3:
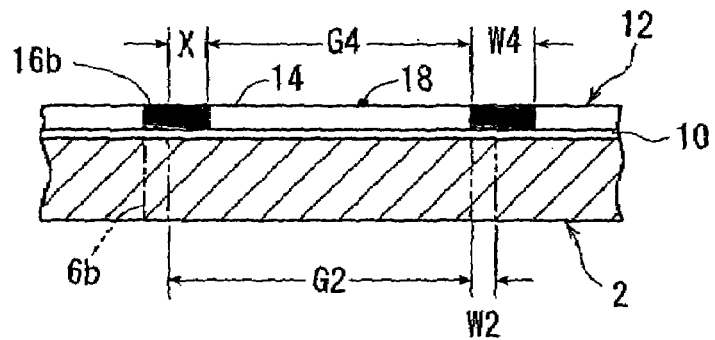
FIG. 3 is a sectional view showing a first exposure step of exposing a resist film of the wafer shown in FIG. 1 with the use of the exposure mask shown in FIG. 2.
Figure 5:
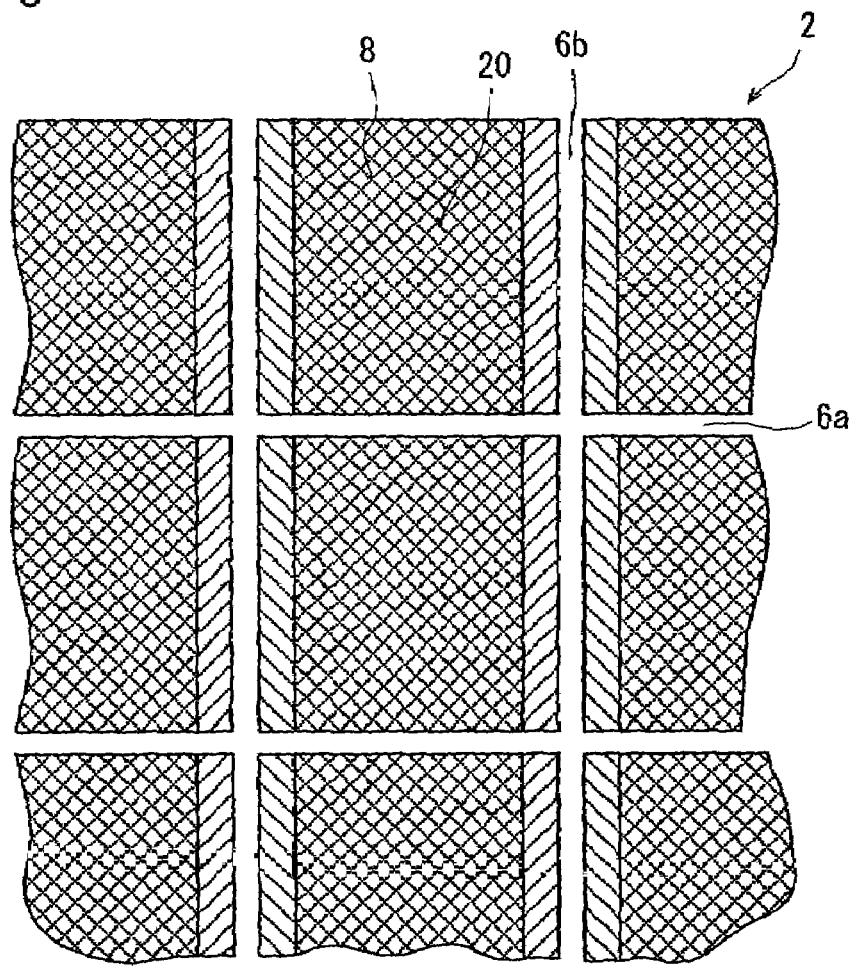
FIG. 5 is a plan view showing portions of the resist film to be exposed in each of the first exposure step and the second exposure step.

In further detail, in the first exposure step, the first light shielding region 16a of the exposure mask 12 is aligned with the first cutting street 6a of the wafer 2, and one side edge (left side edge in FIG. 3) of the second light shielding region 16b of the exposure mask 12 is aligned with one side edge (left side edge in FIG. 3) of the second cutting street 6b in the wafer 2, to cover the upper surface of the wafer 2 with the exposure mask 12, as shown in FIG. 3. Then, the resist film 10 is irradiated with suitable light through the exposure mask 12 to expose the resist film 10. By so doing, the resist film 10 is exposed in correspondence with a portion in the rectangular region 8 excluding a left side edge portion, as indicated by oblique lines inclined rightwardly downwardly in FIG. 5. If fine dust 18 is present in the light transmission region 14 of the exposure mask 12 as shown in FIG. 3, an unexposed area 20 corresponding to the dust 18 is allowed to remain in the resist film 10 as indicated by a black spot in FIG. 5.

Figure 4:
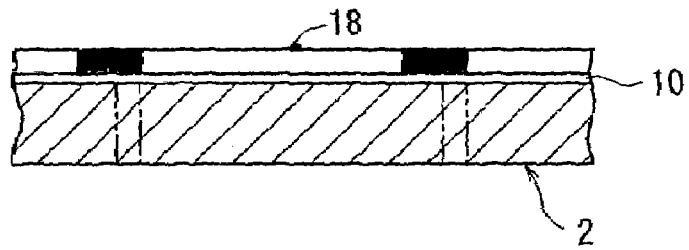
FIG. 4 is a sectional view showing a second exposure step of exposing the resist film of the wafer shown in FIG. 1 with the use of the exposure mask shown in FIG. 2.

Upon completion of the above-described first exposure step, the exposure mask 12 is displaced by the predetermined dimension X relative to the wafer 2 in a predetermined direction along the extending direction of the first light shielding region 16a (accordingly, the extending direction of the first cutting street 6a), namely, leftwardly in FIGS. 3 and 4, as shown in FIG. 4. As a result, the right side edge of the second light shielding region 16b of the exposure mask 12 is brought into alignment with the right side edge of the second cutting street 6b of the wafer 2. Then, the resist film 10 is irradiated with suitable light through the exposure mask 12 to expose the resist film 10. By so doing, the resist film 10 is exposed in correspondence with a portion in the rectangular region 8 excluding a right side edge portion, as indicated by oblique lines inclined leftwardly downwardly in FIG. 5. Thus, after the first exposure step and the second exposure step are performed, the resist film 10 is exposed in correspondence with the whole of the rectangular region 8, so that even the unexposed area 20 allowed to remain owing to the dust 18 in the first exposure step is exposed in the second exposure step. It is important that the above predetermined dimension X be somewhat larger than the dimension of fine dust whose presence is expected in a clean room where the exposure step is carried out. Generally, the predetermined dimension X is preferably of the order of 10 to 50 μm.

When the resist film 10 is developed upon execution of the above-described first and second exposure steps, the unexposed areas of the resist film 10, namely, the portions corresponding to the first cutting streets 6a and the second cutting streets 6b, are removed. Then, the one surface of the wafer 2 is etched in an appropriate manner. As a result, the wafer 2 is cut along the first cutting streets 6a and the second cutting streets 6b where the resist film 10 is absent, whereby the plurality of rectangular regions 8 are separated individually.

While the preferred embodiments of the exposure method constructed in accordance with the present invention have been described in detail by reference to the accompanying drawings, it is to be understood that the present invention is not limited to such embodiments, but various changes and modifications may be made without departing from the scope of the invention.

What we claim is:

1. An exposure method for exposing a resist film disposed on one surface of a wafer, the wafer having a plurality of first cutting streets extending parallel with predetermined spacing, a plurality of second cutting streets extending parallel with predetermined spacing and perpendicularly to the first cutting streets, and a plurality of rectangular regions partitioned by the first cutting streets and the second cutting streets defined on the said one surface thereof, said method comprising:

a providing step of providing an exposure mask;
  a first exposure step of locating the exposure mask at a first predetermined position with respect to the wafer, and exposing the resist film through the exposure mask; and
  a second exposure step of displacing the exposure mask relative to the wafer by a predetermined dimension in a predetermined direction to locate the exposure mask at a second predetermined position, and exposing the resist film through the exposure mask,
  wherein the predetermined dimension is 10 to 50 μm,
  wherein the exposure mask has a plurality of first light shielding regions extending parallel with predetermined spacing, a plurality of second light shielding regions extending parallel with predetermined spacing and perpendicularly to the first light shielding regions, and a plurality of rectangular light transmission regions partitioned by the first light shielding regions and the second light shielding regions, and the predetermined direction is a direction of extension of the first light shielding regions,
  wherein the first light shielding regions, the second light shielding regions, and the light transmission regions of the exposure mask are in correspondence with the first cutting streets, the second cutting streets, and the rectangular regions of the wafer, and
  wherein a width of the second light shielding region is a width of the second cutting street plus the predetermined dimension.

* * * * *